(12) United States Patent
Kawakubo et al.

(10) Patent No.: US 7,567,018 B2
(45) Date of Patent: Jul. 28, 2009

(54) MICRO-MECHANICAL DEVICE, MICRO-SWITCH, VARIABLE CAPACITOR HIGH FREQUENCY CIRCUIT AND OPTICAL SWITCH

(75) Inventors: Takashi Kawakubo, Yokohama-shi (JP);
Toshihiko Nagano, Kawasaki-shi (JP);
Kazuhide Abe, Kawasaki-shi (JP);
Michihiko Nishigaki, Kawasaki-shi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 484 days.

(21) Appl. No.: 11/400,407

(22) Filed: Apr. 10, 2006

(65) Prior Publication Data

US 2006/0285255 A1   Dec. 21, 2006

(30) Foreign Application Priority Data

Jun. 17, 2005   (JP) .............................. 2005-178367

(51) Int. Cl.
*H01L 41/08*   (2006.01)
(52) U.S. Cl. .................. 310/328; 310/331; 310/332; 200/181
(58) Field of Classification Search ................ 310/328, 310/330–332; 200/181
See application file for complete search history.

(56) References Cited

U.S. PATENT DOCUMENTS

| | | | | |
|---|---|---|---|---|
| 3,500,451 | A * | 3/1970 | Yando ........................ | 310/330 |
| 4,387,318 | A * | 6/1983 | Kolm et al. .................. | 310/330 |
| 4,884,090 | A * | 11/1989 | Tanaka et al. ............... | 396/463 |
| 6,980,388 | B2 * | 12/2005 | Ishikawa et al. .............. | 360/75 |
| 7,126,254 | B2 * | 10/2006 | Nanataki et al. ............. | 310/324 |
| 7,135,940 | B2 * | 11/2006 | Kawakubo et al. ......... | 333/17.1 |
| 7,202,591 | B2 * | 4/2007 | Arbogast et al. ............. | 310/332 |
| 7,215,066 | B2 * | 5/2007 | Kawakubo et al. .......... | 310/348 |
| 7,345,404 | B2 * | 3/2008 | Klee et al. ................... | 310/330 |
| 7,368,860 | B2 * | 5/2008 | Wood et al. .................. | 310/367 |
| 7,420,320 | B2 * | 9/2008 | Sano et al. ................... | 310/363 |
| 7,459,827 | B2 * | 12/2008 | Kawakubo et al. .......... | 310/309 |
| 7,459,833 | B2 * | 12/2008 | Kawakubo et al. .......... | 310/328 |
| 7,471,031 | B2 * | 12/2008 | Kawakubo et al. .......... | 310/330 |
| 2002/0050882 | A1 * | 5/2002 | Hyman et al. ................. | 335/78 |
| 2004/0075364 | A1 * | 4/2004 | Mehta ......................... | 310/324 |
| 2005/0194867 | A1 * | 9/2005 | Kawakubo et al. .......... | 310/348 |

(Continued)

FOREIGN PATENT DOCUMENTS

JP   62-44711   2/1987

(Continued)

OTHER PUBLICATIONS

U.S. Appl. No. 11/229,694, filed Sep. 20, 2005, Takashi Kawakubo, et al.

*Primary Examiner*—Jaydi SanMartin
(74) *Attorney, Agent, or Firm*—Oblon, Spivak, McClelland, Maier & Neustadt, P.C.

(57) ABSTRACT

A micro-mechanical device includes a first piezoelectric actuator including a piezoelectric film, and lower and upper electrodes interleaving the piezoelectric film, and extending from a first fixing part on a substrate to a first operating end, and a second piezoelectric actuator connected to the first piezoelectric actuator via a connecting part at the first operating end of the first piezoelectric actuator, and extending from the connecting part to a second operating end, the second piezoelectric actuator being shorter than the first piezoelectric actuator.

16 Claims, 19 Drawing Sheets

U.S. PATENT DOCUMENTS

| | | | |
|---|---|---|---|
| 2005/0242687 A1* | 11/2005 | Kawakubo et al. | 310/324 |
| 2006/0055287 A1 | 3/2006 | Kawakubo et al. | |
| 2006/0067840 A1* | 3/2006 | Kawakubo et al. | 417/413.2 |
| 2006/0098059 A1* | 5/2006 | Ohguro et al. | 347/72 |
| 2006/0119227 A1* | 6/2006 | Ikehashi | 310/348 |
| 2006/0180953 A1* | 8/2006 | Wood et al. | 264/328.1 |
| 2006/0227489 A1* | 10/2006 | Bunyan et al. | 361/160 |
| 2007/0209176 A1* | 9/2007 | Kawakubo et al. | 29/25.35 |
| 2007/0228887 A1* | 10/2007 | Nishigaki et al. | 310/332 |
| 2008/0238257 A1* | 10/2008 | Kawakubo et al. | 310/328 |

FOREIGN PATENT DOCUMENTS

| | | | |
|---|---|---|---|
| JP | 02-025081 | | 1/1990 |
| JP | 04-129043 | | 4/1992 |
| JP | 06-230295 | | 8/1994 |
| JP | 2000-348594 | | 12/2000 |
| JP | 2004-221285 | | 8/2004 |
| JP | 2005-092987 | | 4/2005 |
| JP | 2005-094585 | | 4/2005 |
| JP | 2005260208 A | * | 9/2005 |
| JP | 2006093463 A | * | 4/2006 |
| JP | 2008238330 A | * | 10/2008 |
| WO | WO 03-062899 | | 7/2003 |

* cited by examiner

MICRO-MECHANICAL DEVICE, MICRO-SWITCH, VARIABLE CAPACITOR HIGH FREQUENCY CIRCUIT AND OPTICAL SWITCH

CROSS REFERENCE TO RELATED APPLICATIONS

This application is based upon and claims the benefit of priority from prior Japanese Patent Application No. 2005-178,367 filed on Jun. 17, 2005; the entire contents of which are incorporated by reference herein.

BACKGROUND OF THE INVENTION

1. Filed of the Invention

This invention relates to a micro-mechanical device, a micro-switch, a variable capacitor, a high frequency circuit and an optical switch, and more particularly relates to a micro-mechanical device, a micro-switch, a variable capacitor, a high frequency circuit and an optical switch, all of which include piezoelectric actuators made of piezoelectric thin films.

2. Description of the Related Art

There are thin-film actuators which are manufactured as micro-mechanical devices using the micro-electro-mechanical system (MEMS). Micro-switches, variable capacitors and so on including thin-film actuators are activated by electrostatic force. Specifically, driving force is applied to a pair of electrodes which are positioned with a space, so that electrostatic force is generated in order to activate the electrodes.

A voltage of several ten volts is required to displace such electro-static switches in order to accomplish mechanical switching. For instance, since a power supply of 5V or less is used for a cellular phone, a step-up transformer is necessary for the purpose of obtaining a power voltage of several ten volts. Therefore, there is a problem that the power supply has to be enlarged, and becomes very expensive.

In order to overcome the foregoing problem, there has been proposed a thin-film actuator in which cantilevers are displaced by piezoelectric strain (refer to Japanese Patent Laid-Open Publication No. 2000-348,594). With this actuator, displacement necessary for switching can be accomplished by applying a voltage of several volts compared with the electrostatic switch.

A movable distance of a piezoelectric thin-film actuator is proportional to a square of length of its cantilevers while driving force thereof is inversely proportional to a square of the length of the cantilevers. The longer the cantilevers, the smaller the driving force. If an electrode at a free end of the cantilevers and an electrode on a front surface of a substrate are in firm contact with each other, it is very difficult to produce driving force to separate them. This will lead to a malfunction of the thin-film actuator.

The present invention has been contemplated in order to overcome the foregoing problem of the related art, and is intended to provide a micro-mechanical device, a micro-switch, a variable capacitor, a high frequency circuit, and an optical switch.

BRIEF SUMMARY OF THE INVENTION

According to a first aspect of the embodiment of the invention, there is provided a micro-mechanical device which includes: a first piezoelectric actuator including a piezoelectric film and lower and upper electrodes interleaving the piezoelectric film, and extending from a first fixing part on a substrate to a first operating end; and a second piezoelectric actuator connected to the first piezoelectric actuator via a connecting part at the first operating end of the first piezoelectric actuator, and extending from the connecting part to a second operating end, the second piezoelectric actuator being shorter than the first piezoelectric actuator.

According to a second aspect of the embodiment of the invention, there is provided a micro-switch which includes: a first piezoelectric actuator including a piezoelectric film and lower and upper electrodes interleaving the piezoelectric film, and extending from a first fixing part on a substrate to a first operating end; a second piezoelectric actuator connected to the first piezoelectric actuator via a connecting part at the first operating end of the first piezoelectric actuator, and extending from the connecting part to a second operating end, the second piezoelectric actuator being shorter than the first piezoelectric actuator; a movable electrode provided at the first operating end; and a stationary electrode provided on the substrate and facing with the movable electrode.

According to a third aspect of the embodiment of the invention, there is provided a variable capacitor which includes: a first piezoelectric actuator including a piezoelectric film and lower and upper electrodes interleaving the piezoelectric film, and extending from a first fixing part on a substrate to a first operating end; a second piezoelectric actuator connected to the first piezoelectric actuator via a connecting part at the first operating end of the first piezoelectric actuator, and extending from the connecting part to a second operating end, the second piezoelectric actuator being shorter than the first piezoelectric actuator; a movable electrode provided at the first operating end; a stationary electrode provided on the substrate and facing with the movable electrode: and a dielectric film provided on the stationary electrode.

According to a fourth aspect of the embodiment of the invention, there is provided a high frequency circuit comprising the variable capacitor, in which a capacity of the high frequency circuit is controlled by a control voltage of a voltage-controlled oscillator.

According to a final aspect of the embodiment of the invention, there is provided an optical switch includes: a first piezoelectric actuator including a first piezoelectric film and lower and upper electrodes interleaving the first piezoelectric film, and extending from a first fixing part on a substrate to a first operating end; a second piezoelectric actuator including a second piezoelectric film and second lower and upper electrodes interleaving the second piezoelectric film, and extending from a second fixing part on a substrate to a second operating end; and a mirror extending along side edges of the first and second piezoelectric actuators, the mirror having a first side edge thereof connected to a first connector of the first piezoelectric actuator, and having a second side edge thereof connected to a second connector of the second piezoelectric actuator. A distance between the first connector of the first piezoelectric actuator and the first operating end is shorter than a distance between the first fixing part and the first connector; and a distance between the second connector of the second piezoelectric actuator and the second operating end is shorter than a distance between the second fixing part and the second connector.

BRIEF DESCRIPTION OF THE SEVERAL DRAWINGS

DETAILED DESCRIPTION OF THE INVENTION

Figure 1:
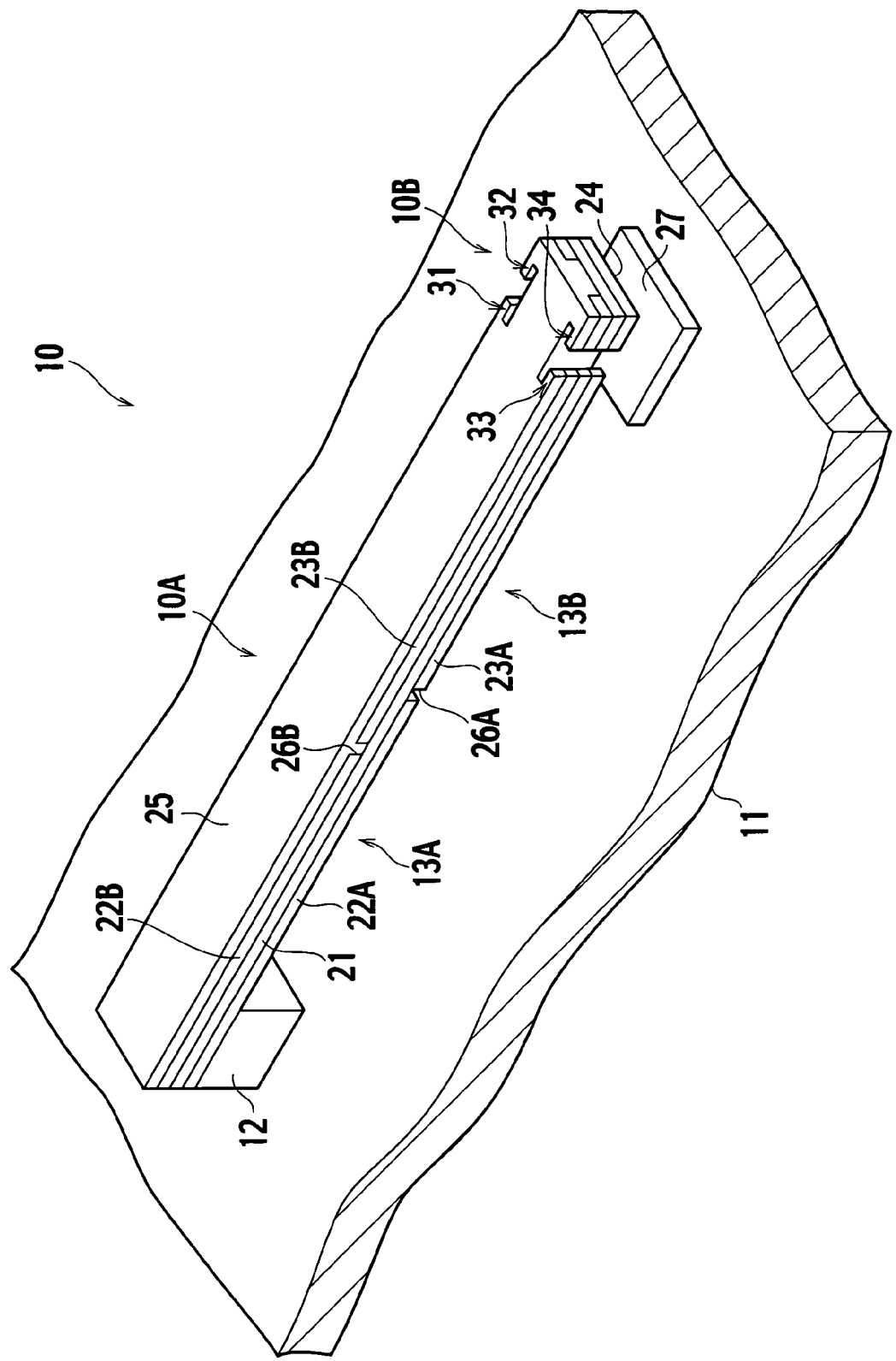
FIG. 1 is a perspective view of a micro-mechanical device according to a first embodiment of the invention.

The invention will be described with reference to the embodiments shown in the drawings, in which like numerals refer to like parts throughout. The drawings are schematic, and ratios between depth and size of respective layers may differ from those of actual products. Further, sometimes different ratios may be used in drawings.

FIRST EMBODIMENT

A micro-mechanical device 10 is applied as a micro-switch or like, and includes a main actuator 10A (a first piezoelectric actuator) in the shape of a cantilever, and a subsidiary actuator (a second piezoelectric actuator) 10B at an operating end (a first operating end) of the main actuator 10A.

Specifically, one end of the main actuator 10A is fixedly attached on a substrate 11 via an anchor 12 (a first fixing part). The main actuator 10A is constituted by a piezoelectric film 21, first and second lower electrodes 22A and 23A on the piezoelectric film 21 whose surface faces with the substrate 11, first and second upper electrodes 22B and 23B facing with the first and second lower electrodes 22A and 23A via the piezoelectric film 21, and a support film 25 provided on the first and second upper electrodes 22B and 23B. A slit 26A is formed between the lower electrodes 22A and 23A, and a slit 26B is formed between the upper electrodes 22B and 23B.

The subsidiary actuator 10B at the operating end of the main actuator 10A is constituted by a part of the main actuator which includes the piezoelectric film 21, lower electrode 23A, upper electrode 23B and support film 25. A part of the second lower electrode 23A functions as a movable electrode 24 of the micros-switch. The movable electrode 24 faces with a stationary electrode 27 provided on the substrate 11.

The substrate 11 is an insulating glass substrate, a silicon (Si) semiconductor substrate or the like. The anchor 12 is made of an insulating film of silicon oxide ($SiO_2$) film or the like. The support film 25 is an insulating film of silicon oxide ($SiO_2$), silicon nitride ($Si_3N_4$) or the like. The first and second lower electrodes 22A and 23A, first and second upper electrodes 22B and 23B and stationary electrode 27 are preferably made of metals which are easy to handle and have low resistances, e.g., aluminum (Al), gold (Au), platinum (Pt), copper (Cu), iridium (Ir), tungsten (W), and molybdenum (Mo). The piezoelectric film 21 is preferably made of wurtzite which has stable crystals, is easy to manufacture, and is compatible with the Si process, e.g., aluminum nitride (AlN), zinc oxide (ZnO) and so on. Further, lead zirconate titanate (PZT) is also preferable.

Figure 2:
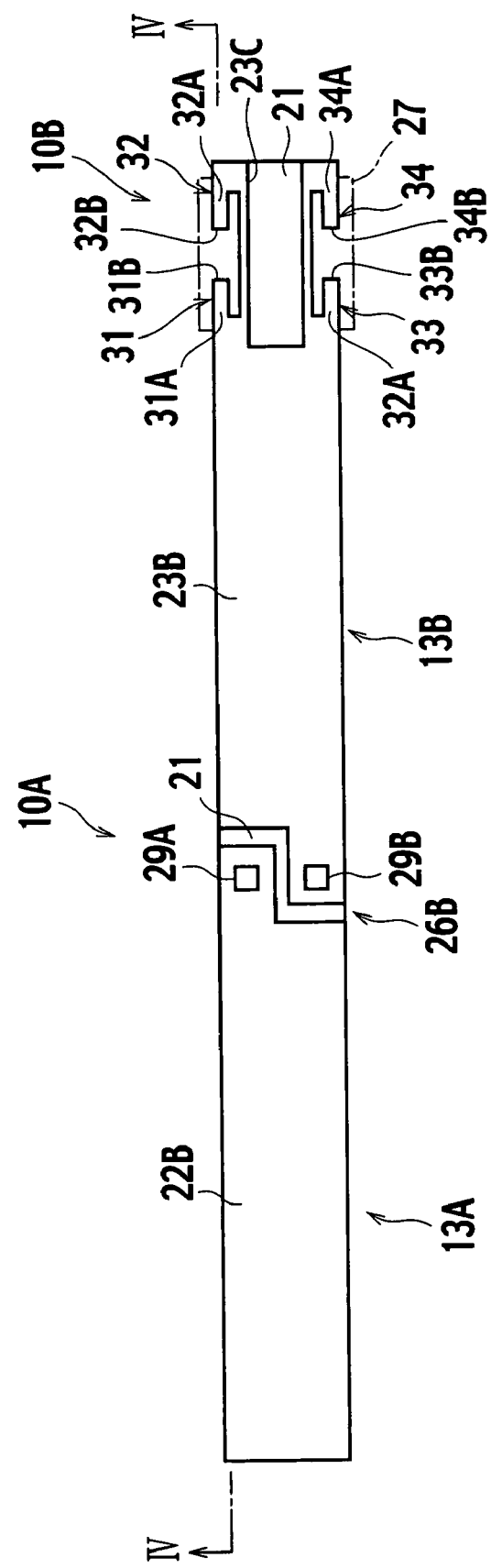
FIG. 2 is a top plan view of upper electrodes of the micro-mechanical device.

As shown in FIG. 2, the upper electrodes 22B and 23B are electrically insulated from each other via the slit 26B. Further, as shown in FIG. 3, the lower electrodes 22A and 23A are electrically insulated from each other via the slit 26A.

The first upper electrode 22B and the second lower electrode 23A are connected by a via-metal 29A. Further, the second upper electrode 23B and the first lower electrode 22A are connected by a via-metal 29B.

Figure 4:
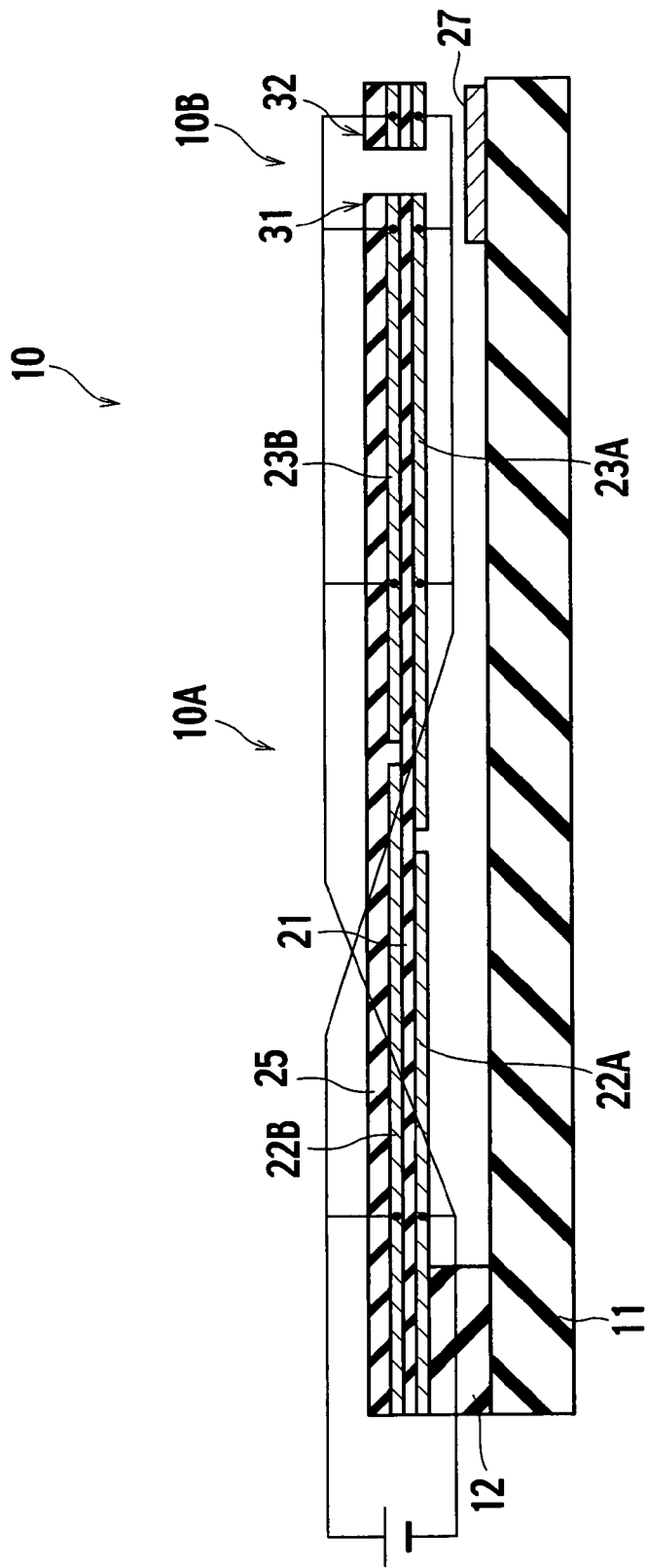
FIG. 4 is a cross section of the micro-mechanical device of FIG. 1, taken along line IV-IV in FIG. 2.

Referring to FIG. 4, when a voltage is applied to the first upper electrode 22B and the first lower electrode 22A (facing with the first upper electrode 22B), a voltage reverse to the foregoing voltage is applied to the second upper electrode 23B and the second lower electrode 23A (facing with the second upper electrode 23B). In the main actuator 10A, reverse voltages are applied to a first region 13A where the first upper and lower electrodes 22B and 22A face with each other, and to a second region 13B where the second upper and lower electrodes 23B and 22B face with each other.

Figure 3:
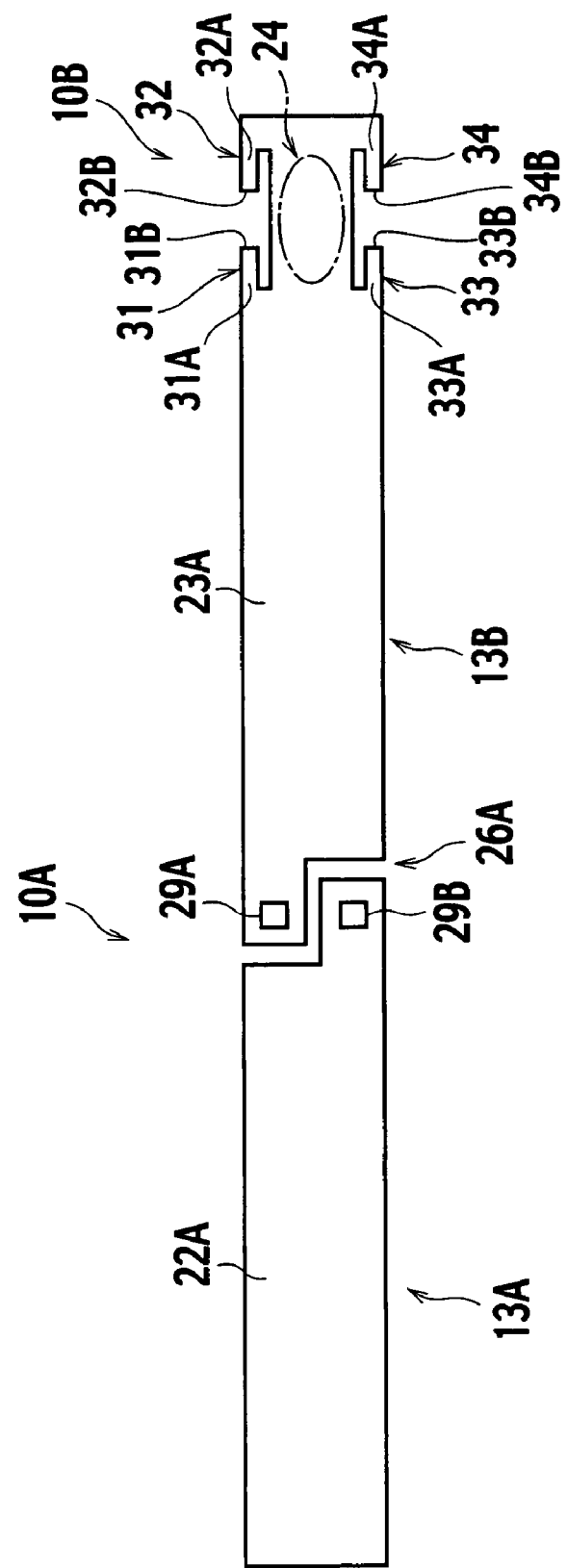
FIG. 3 is a top plan view of lower electrodes of the micro-mechanical device.

As shown in FIG. 1 to FIG. 3, the subsidiary actuator 10B at the operating end of the main actuator 10A includes first to fourth cantilevers 31 to 34, which extend along opposite side edges of the subsidiary actuator 10B. At the cantilevers 31 to 34, the second lower electrode 23A, piezoelectric film 21, second upper electrode 23B and support film 25 are stacked one over after another. Tips of the cantilevers 31 to 34 constitute operating ends 31B to 34B (second operating ends) via support points 31A to 34A. With the subsidiary actuator 10B, the operating end 31B and the operating end 32B face with each other while the operating end 33B and the operating end 34B face with each other.

The subsidiary actuator 10B is constituted by a part of the second upper and lower electrodes 23B and 23A of the main actuator 10A. Therefore, a voltage similar to that of the second upper electrode 23B and second lower electrode 23A of the main actuator 10A is applied to the subsidiary actuator 10B.

When the voltages are applied to the first and second lower and upper electrodes 22A, 23A, 22B and 23B, the piezoelectric film 21 sandwiched between them expands and contracts due to the piezoelectric effect. In this state, the support film 25 has nothing to do with the piezoelectric effect, so that the first region 13A and second region 13B of the main actuator 10A are displaced in a direction perpendicular to the surface of the substrate 11 depending upon polarities of the voltages applied to the electrodes in the foregoing regions.

Figure 5:
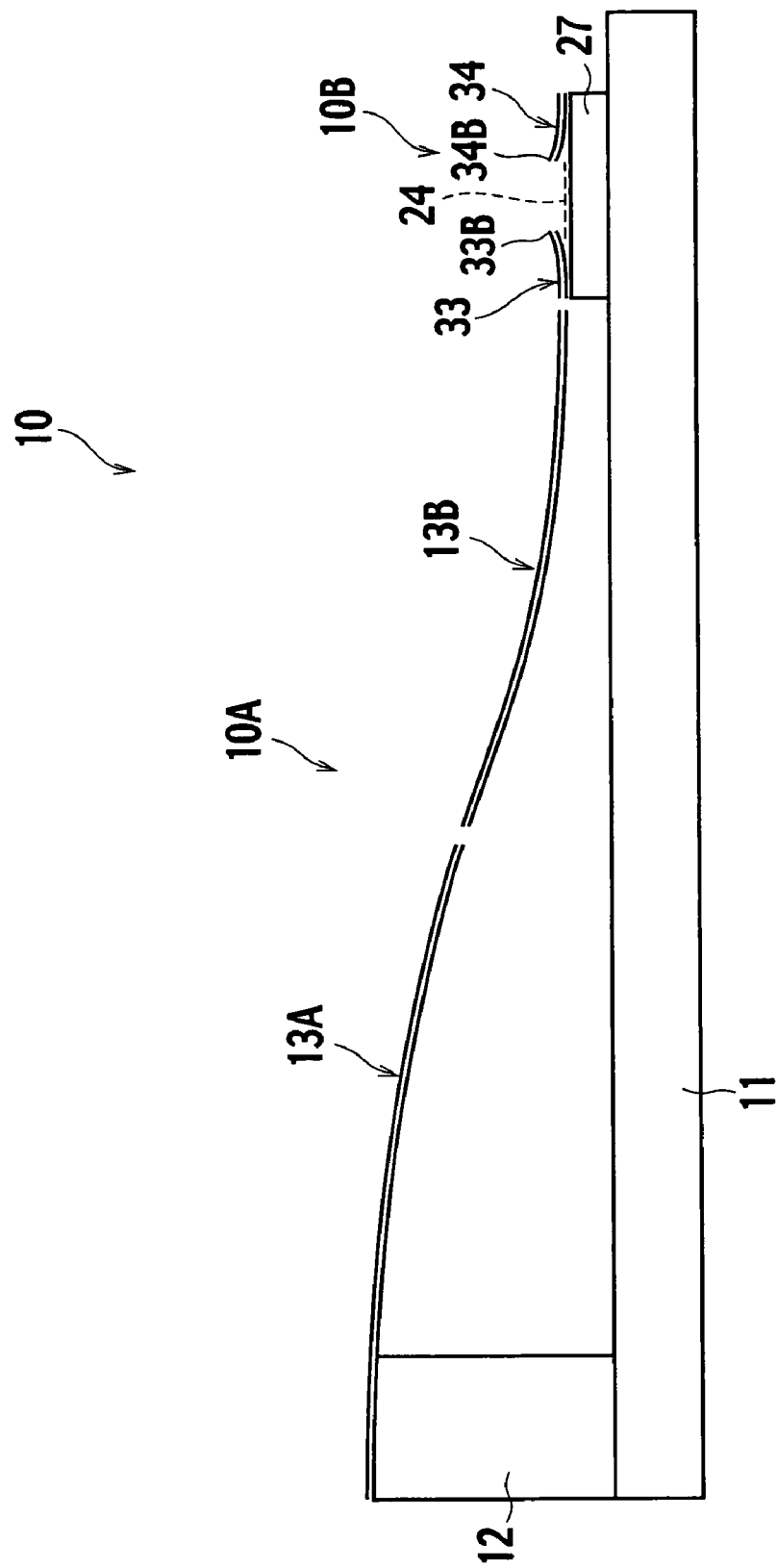
FIG. 5 is a schematic side elevation of the micro-mechanical device of FIG. 1, showing the operation thereof.

Referring to FIG. 5, the piezoelectric film 21 contracts in response to the voltage applied to the first upper and lower electrodes 22A and 22B in the first region 13A, so that the main actuator 10A bends toward the substrate 11 in the region 13A. On the contrary, when the piezoelectric film 21 expands in response to the reverse voltage applied to the second lower and upper electrodes 23A and 23B. Therefore, the main actuator 10A bends in a direction away from the substrate 11.

The main actuator 10A bends in the shape of letter S between the region 13A at the end connected to the anchor 12 and the region 13B at the operating end, where the movable electrode 24 constituted by the second lower electrode 23A (shown in FIG. 3) is brought into substantially parallel contact with the surface of the stationary electrode 27.

The cantilevers 31 to 34 of the subsidiary actuator 10B bend similarly to the second region 13B, so that the operating ends 31B to 34B bend in a direction off from the stationary electrode 27 of the substrate 11.

When the reverse voltages are applied to the first and second lower electrode 22A and 23A and to the first and second upper electrodes 22B and 23B, the main actuator 10A bends at the regions 13A and 13B in opposite directions to the direction due to the piezoelectric effect as shown in FIG. 5. The subsidiary actuator 10B bends at the second region 13B in a direction similar to that of the second region 13B of the main actuator 10A.

The cantilevers 31 to 34 of the subsidiary actuator 10B are shorter than the main actuator 10A. The driving force of the piezoelectric actuator is in reverse proportion to the square of the length of the cantilevers. Therefore, the subsidiary actuator 10B is designed to receive larger driving force than that applied to the main actuator 10A. When the piezoelectric film 21 is made of a aluminum nitride (AlN) or zinc oxide (ZnO) film, the main actuator 10A (both of the first and second regions 13A and 13B) is preferably 500 μm long while the cantilevers 31 to 34 are of the subsidiary actuator 10B are preferably 50 μm long. The driving force of the subsidiary actuator 10B is 100 times stronger than the driving force of the main actuator 10A. Therefore, the movable electrode 24 near the subsidiary actuator 10B can be separated from the stationary electrode with sufficient driving force.

The movable distance of the operating end of the piezoelectric actuator is proportional to the square of the length of the cantilevers. The operating end of the 500 μm-long main actuator 10A is designed to have movable length which is 100 times larger than the movable length of the 50 μm-long subsidiary actuator 10B. In this case, the movable length of the subsidiary actuator 10B is 20 nm while the movable length of the main actuator 10A is approximately 2 μm.

The main actuator 10A is so long that its operating end can be moved by a long distance, and the operating ends 31A to 34A of the subsidiary actuator 10B (at the operating end of the main actuator 10A) can be activated by large driving force. In other words, the long main actuator 10A has small driving force while the short subsidiary actuator 10B can receive a large driving force.

Figure 6:
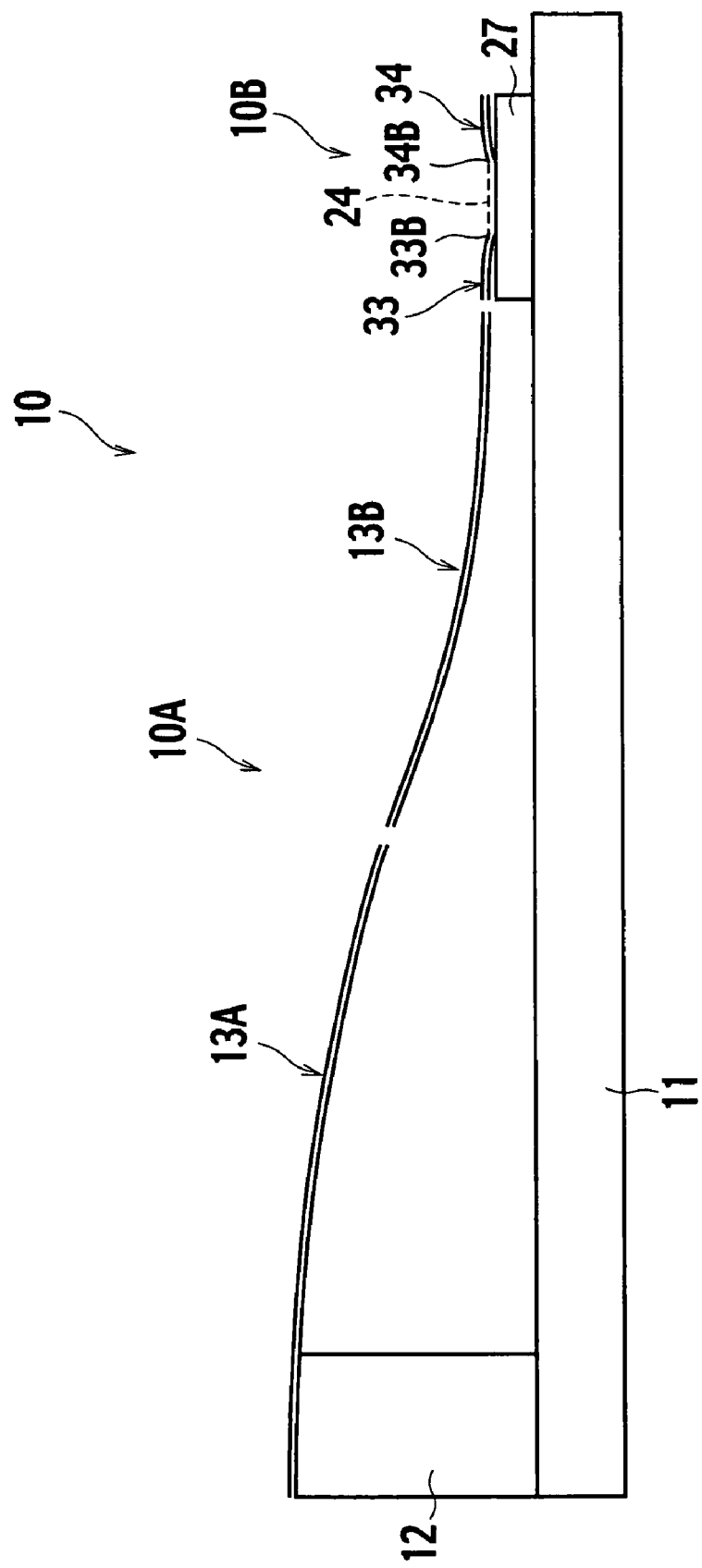
FIG. 6 is a schematic side elevation of the micro-mechanical device of FIG. 1, showing another operation thereof.

When the movable electrode 24 is in contact with the stationary electrode 27 as shown in FIG. 5, reverse voltages are applied to the first and second lower electrodes 22A and 23A and the first and second upper electrodes 22B and 23B. Thereafter, the subsidiary actuator 10B, which is shorter than the first and second regions 13A and 13B of the main actuator 10B, bends with force stronger than that applied to the main actuator 10A. As shown in FIG. 6, the operating ends 31B to 34B of the cantilevers 31 to 34 of the subsidiary actuator 10B push the surface of the stationary electrode 27, so that the movable electrode 24 is separated off from the stationary electrode 27. Refer to FIG. 2, the main actuator 10A is designed not to bend due to a recess 23C at its operating end because no piezoelectric effect is caused by the recess 23C. Therefore, the subsidiary actuator 10B with its surface kept flat can enable the operating ends 31B to 34B to push the surface of the stationary electrode 27.

Figure 7:
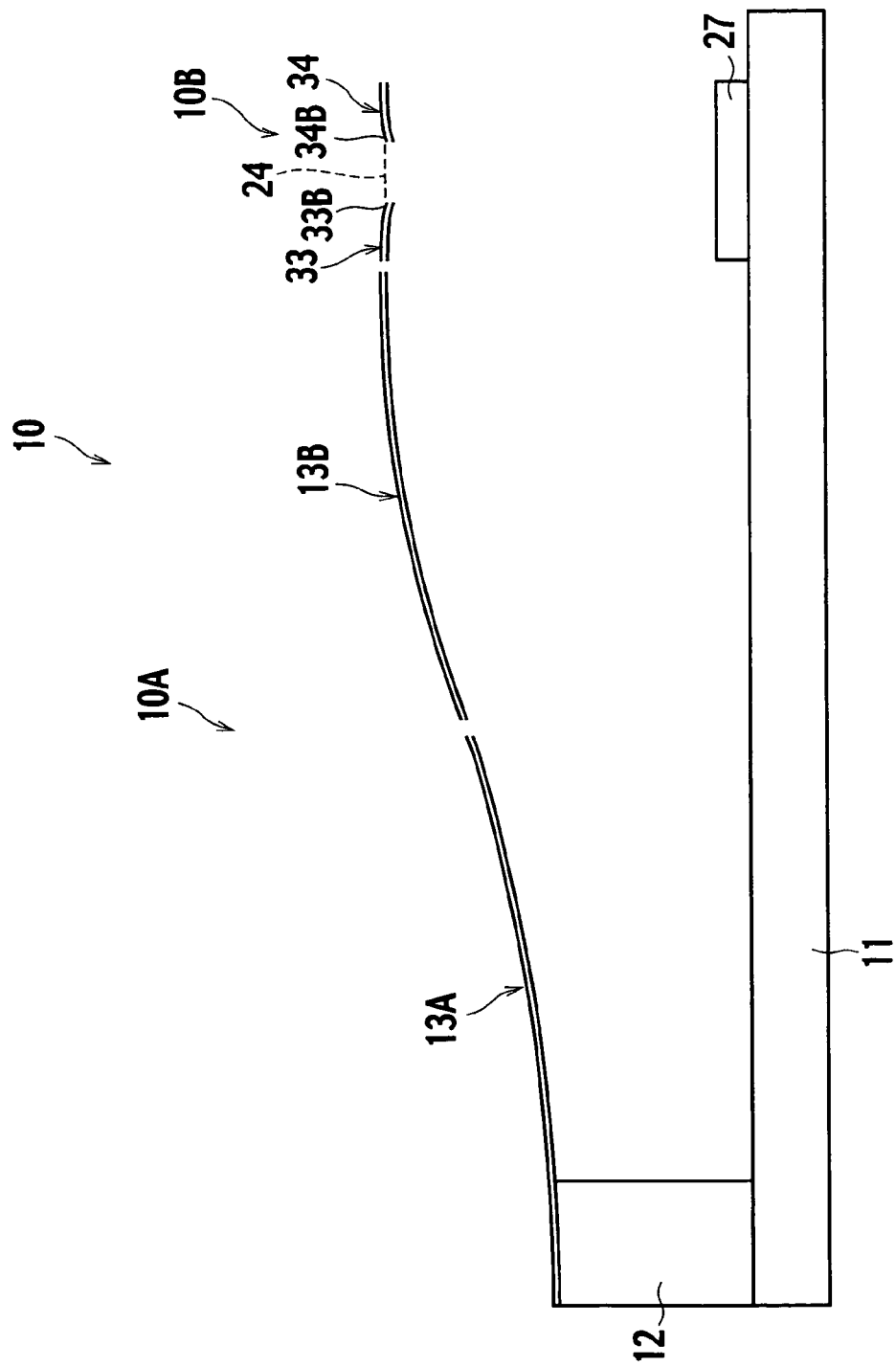
FIG. 7 is a schematic side elevation of the micro-mechanical device of FIG. 1, showing still another operation thereof.

In the foregoing state, the main actuator 10A receives driving force to separate the operating ends thereof from the substrate 11. The main actuator 10A bends and changes its posture shown in FIG. 6 to a posture shown in FIG. 7, so that the movable electrode 24 is separated from the stationary electrode 27 due to the long movable distance of the main actuator 10A.

It is assumed here that the foregoing micro-mechanical device 10 is used as a micro-switch. Application of a predetermined driving voltage allows the main actuator 10A to bend, which brings the movable electrode 24 into contact with the stationary electrode 27. In this state, the micro-switch is activated.

Conversely, when a reverse voltage is applied to the micro-mechanical device 10, the main actuator 10A bends in a direction to separate the operating end thereof from the substrate 11. In this state, the subsidiary actuator 10B bends in a direction where the operating ends 31B to 34B of the cantilevers 31 to 34 are displaced toward the stationary electrode 27 from the movable electrode 24. Even if the movable contact 24 and the stationary contact 24 are in firm contact with each other, they can be separated from each other.

Thereafter, the main actuator 10A which is in the shape of a cantilever and longer than the subsidiary actuator 10B further separates the movable electrode 24 from the stationary electrode 27. In this state, the micro-switch is turned off.

With the micro-mechanical device 10 according to the embodiment of the invention, the long main actuator 10A can lengthen the movable distance of the operating end, and the short subsidiary actuator 10B makes up for the driving force which may be reduced due to the long main actuator 10A. This is effective in reliably operating the operating end of the main actuator 10A.

Alternatively, the movable electrode 24 may be vibrated by frequently reversing the polarities of the voltages applied to the lower electrodes 22A and 23A and the upper electrode 22B and 23B. This facilitates the separation of the movable electrode 24 from the stationary electrode 27.

Example 1

A specific example of the micro-mechanical device 10 will be described hereinafter.

A distance between the movable electrode 24 and the stationary electrode 27 should be 1 μm to 2 μm or longer in order to reliably insulate them during an off-time when the micro-mechanical device 10 is utilized as a high frequency switch in a gigahertz band.

The micro-mechanical device 10 includes a piezoelectric film 21 made of a c-axis-oriented aluminum nitride (AlN), first and second lower electrodes 22A and 23A and first and second upper electrodes 22B and 23B, both of which are made of aluminum (Al). The piezoelectric film 21 is 500 μm long, and 10 nm to 1 μm thick (preferably 500 nm thick). The lower and upper electrodes 22A, 23A, 22B and 23B are 10 nm to 1 μm thick (preferably 50 nm thick). A support film is made of $SiO_2$, and is 50 nm thick.

When a +3V drive voltage is applied, a main actuator 10A bends, and the movable electrode 24 and the stationary electrode 27 are brought into contact with each other. Conversely, the polarity of the drive voltage is reversed, the movable electrode 24 is spaced from the stationary electrode 27 by 2.5 μm. After repeatedly applying the drive voltages, it has been confirmed that the movable and stationary electrodes 24 and 27 reliably come into contact with each other and are separated from each other more than $10^8$ times.

Modified Example

Figure 8:
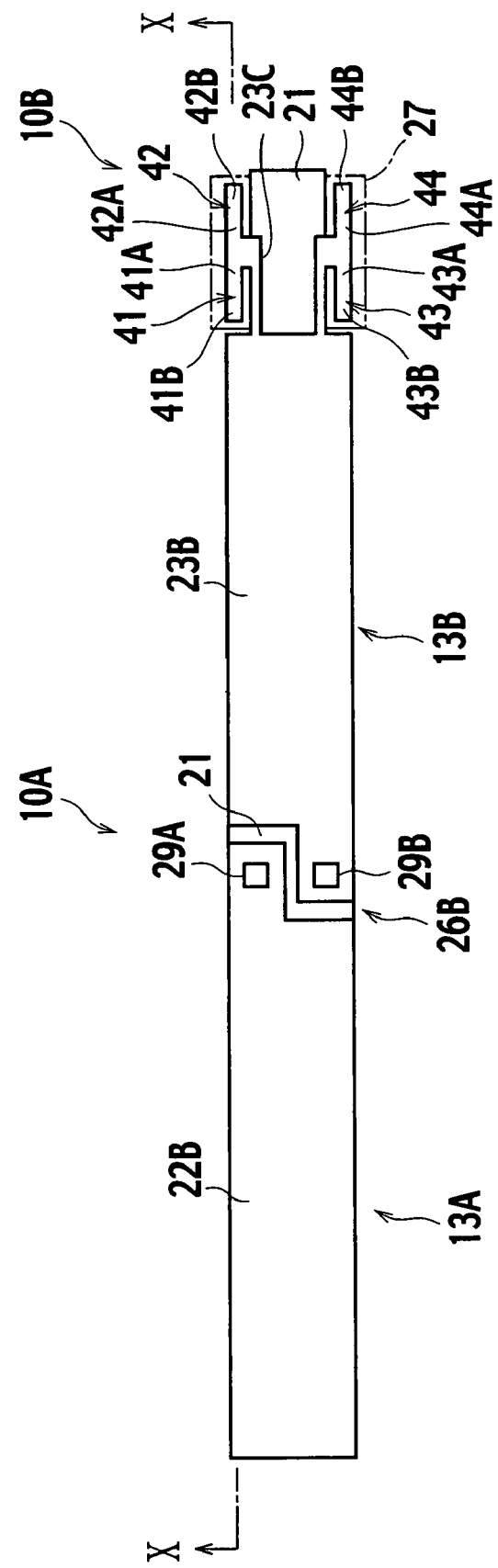
FIG. 8 is a top plan view of upper electrodes in a modified example of the micro-mechanical device of FIG. 1.
Figure 9:
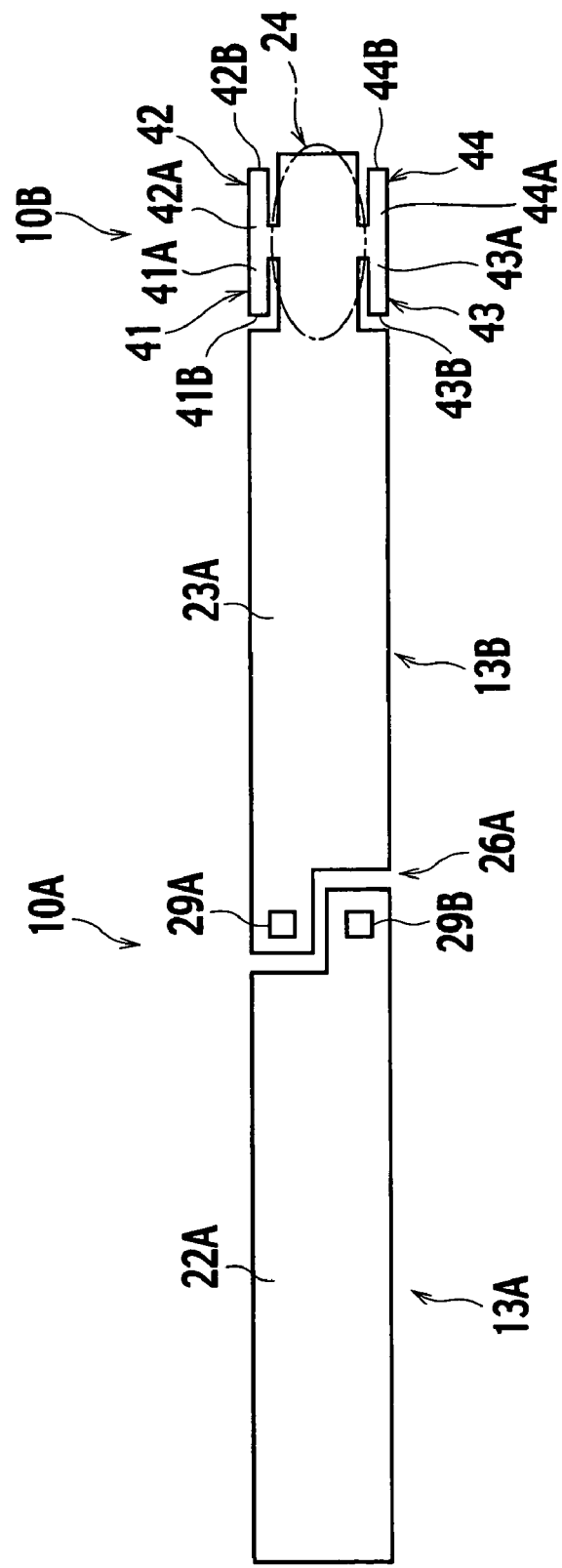
FIG. 9 is a top plan view of lower electrodes in a modified example of the micro-mechanical device of FIG. 1.
Figure 10:
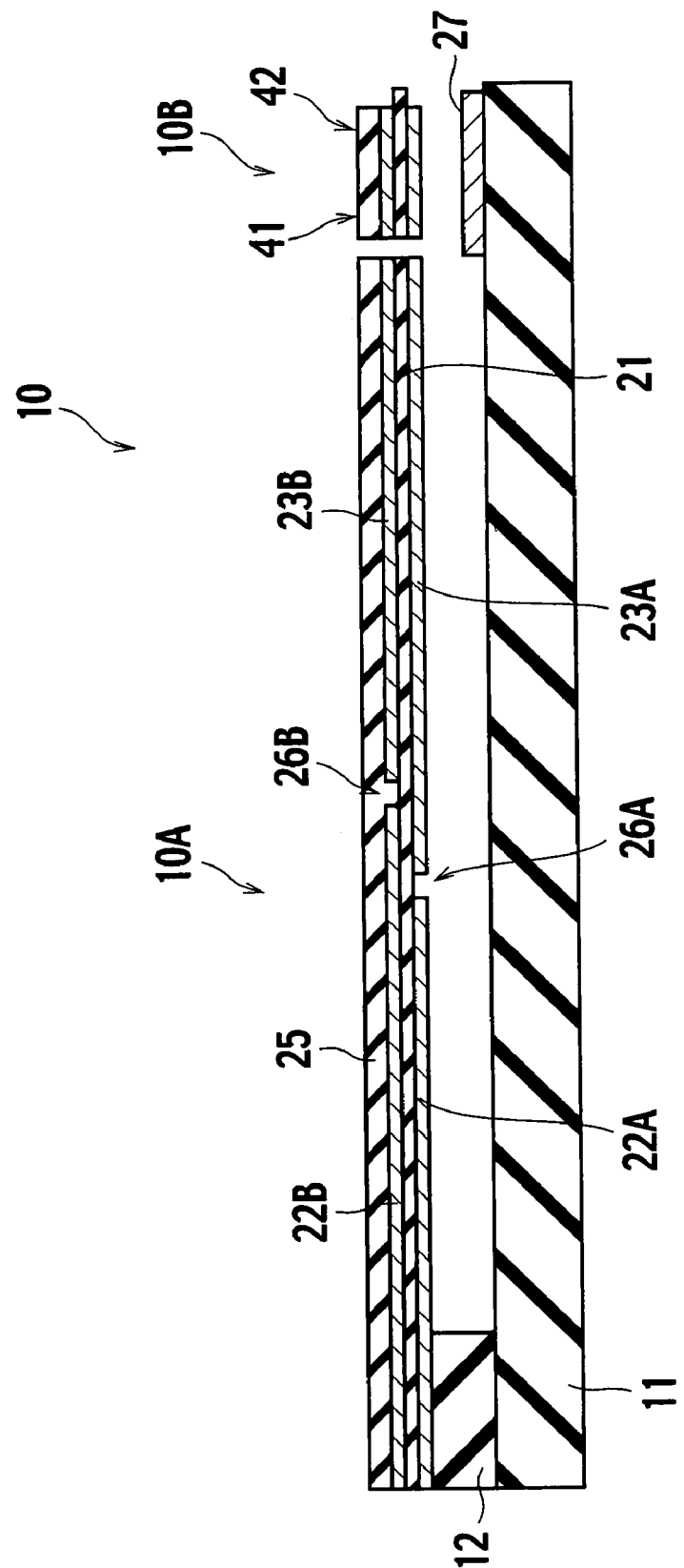
FIG. 10 is a cross section of the upper and lower electrodes, taken along line X-X in FIG. 8.

A modified example of the micro-mechanical device 10 is described with reference to FIG. 8 to FIG. 10. A subsidiary actuator 10B at the operating end of a main actuator 10A includes cantilevers 41 to 44, where a second lower electrode 23A, piezoelectric film 21, second upper electrode 23B and support film 25 are stacked one over after another. Ends of the cantilevers 41 to 44 serve as operating ends 41B to 44B via support points 41A to 44A. The cantilevers 41 to 44 are remarkably shorter than the main actuator 10A similarly to those in the micro-mechanical device 1 shown in FIG. 1.

The support points 41A and 42A are used both by the adjacent cantilevers 41 and 42, so that the operating end 41B (first operating end) and the operating end 42B (second operating end) face in opposite directions. Similarly, the support points 43A and 44A are used for the adjacent cantilevers 43 and 44, so that the operating end 43B (first operating end) and the operating end 44B (second operating end) face in opposite directions. A space between the operating ends 41B and 42B and a space between the operating ends 43B and 44B are enlarged.

Figure 11:
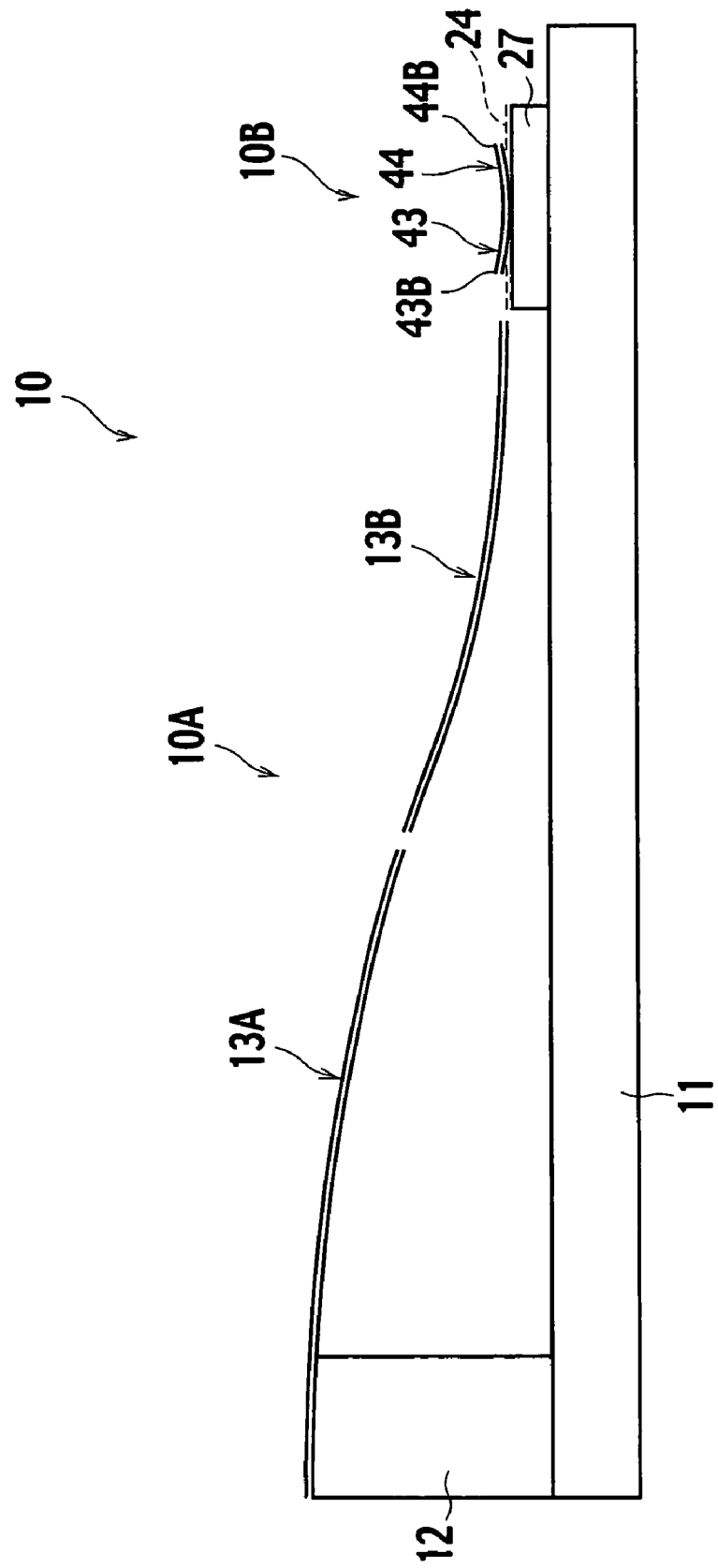
FIG. 11 is a schematic side elevation of the micro-mechanical device in a modified example, showing an operation thereof.
Figure 12:
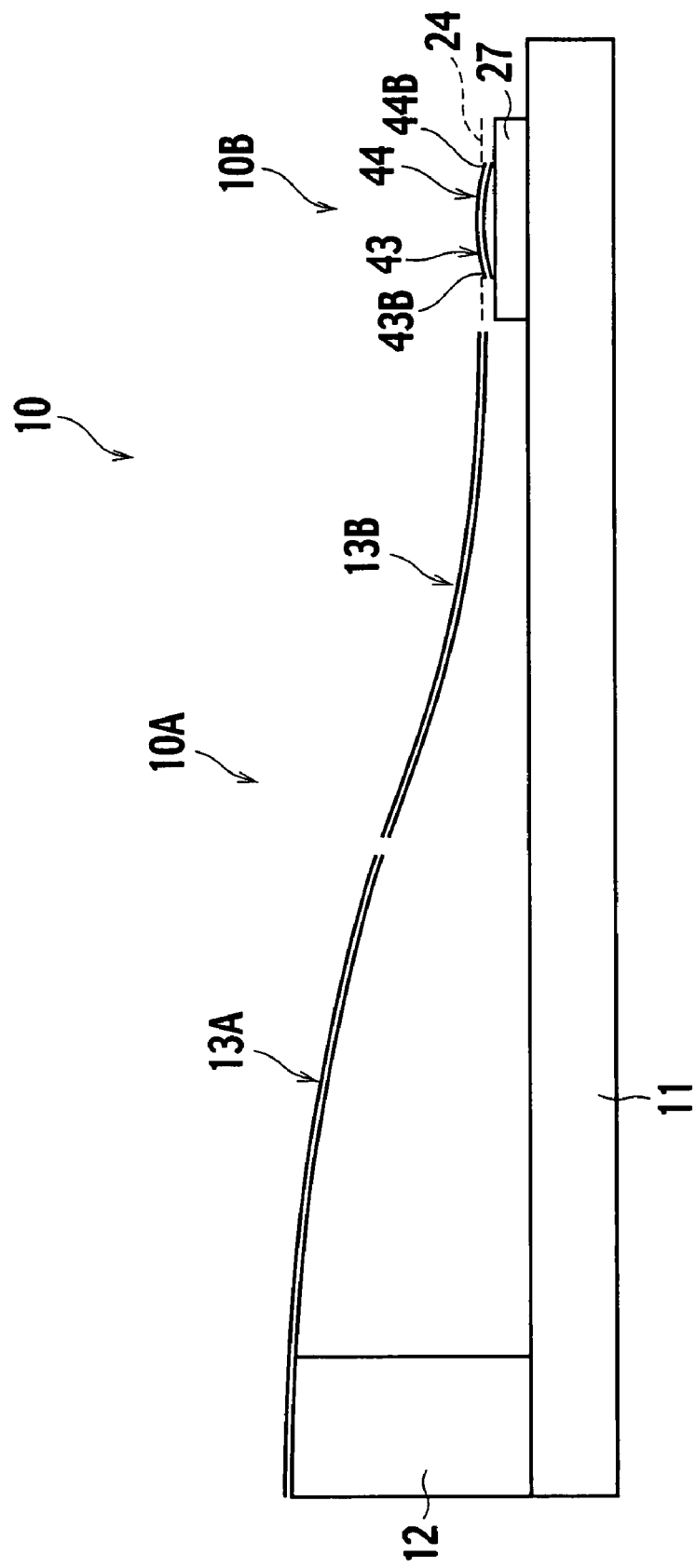
FIG. 12 is a schematic side elevation of the micro-mechanical device in a modified example, showing the operation thereof.

When a drive voltage having a reverse polarity is applied as shown in FIG. 11, the operating ends 41B to 44B of the subsidiary actuator 10B bend and push the surface of the stationary electrode 27 (as shown in FIG. 12).

In the modified example, not only the spaces between the operating ends 41B and 42B and between the operating 43B and 44B are enlarged, which means that the operating ends 41B to 44B are positioned at the four corners of the movable electrode 24. In short, the operating ends 41B to 44B push the four corners of the stationary electrode 27.

Even if the movable electrode 24 is inclined and is in contact with the stationary electrode 27 via only one point, any of the four operating ends 41B to 44B can reliably separate the movable electrode 24 from the stationary electrode 27.

Figure 13:
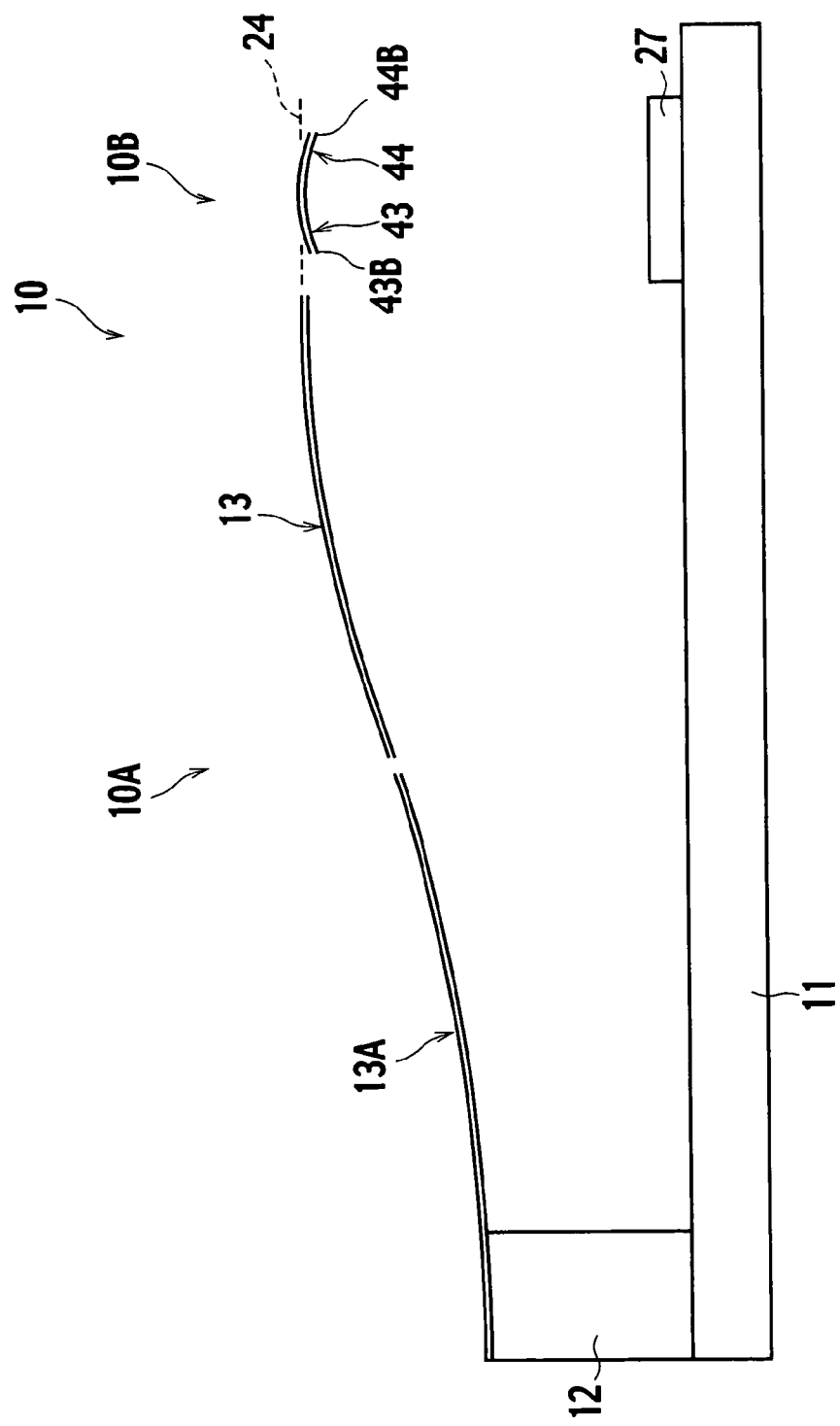
FIG. 13 is a schematic side elevation of the micro-mechanical device in a modified example, showing the operation thereof.

The movable electrode 24 is reliably separated from the stationary electrode 27 by the subsidiary actuator 10B as shown in FIG. 13. Further, the movable electrode 24 has the long moving distance because of the main actuator 10A, which is effective in extensively separating the movable electrode 24 from the stationary electrode 27.

FURTHER EMBODIMENTS

In the following embodiments, the micro-mechanical device 10 is applicable as variable capacitors in which a stationary electrode 27 is covered by a dielectric film and is maintained to not to be in contact with a stationary electrode 27.

In the foregoing embodiment, the main and subsidiary actuators 10A and 10B have a so-called asymmetric bimorph structure, in which lower electrodes, piezoelectric film, upper electrodes and support film are stacked one over after another. In the following embodiments, the main and subsidiary actuators 10A and 10B have a so-called symmetric bimorph structure, in which lower electrodes, first piezoelectric film intermediate electrodes, second piezoelectric film and upper electrodes are stacked one over after another. The actuators will be activated by applying voltages having reverse polarities between the lower electrodes and intermediate electrode, and between the intermediate electrodes and upper electrodes.

SECOND EMBODIMENT

Figure 14:
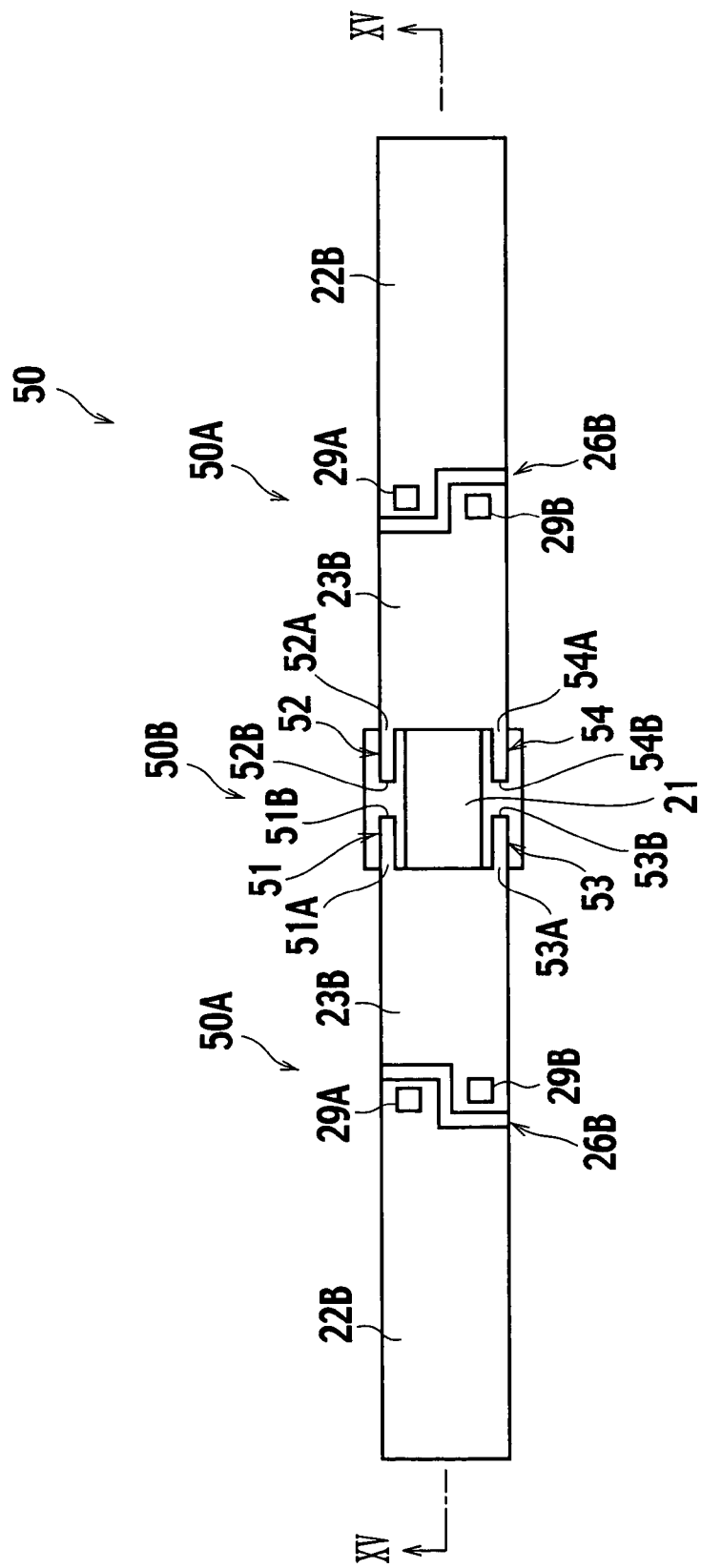
FIG. 14 is a top plan view of upper electrodes of a micro-mechanical device in a second embodiment of the invention.
Figure 15:
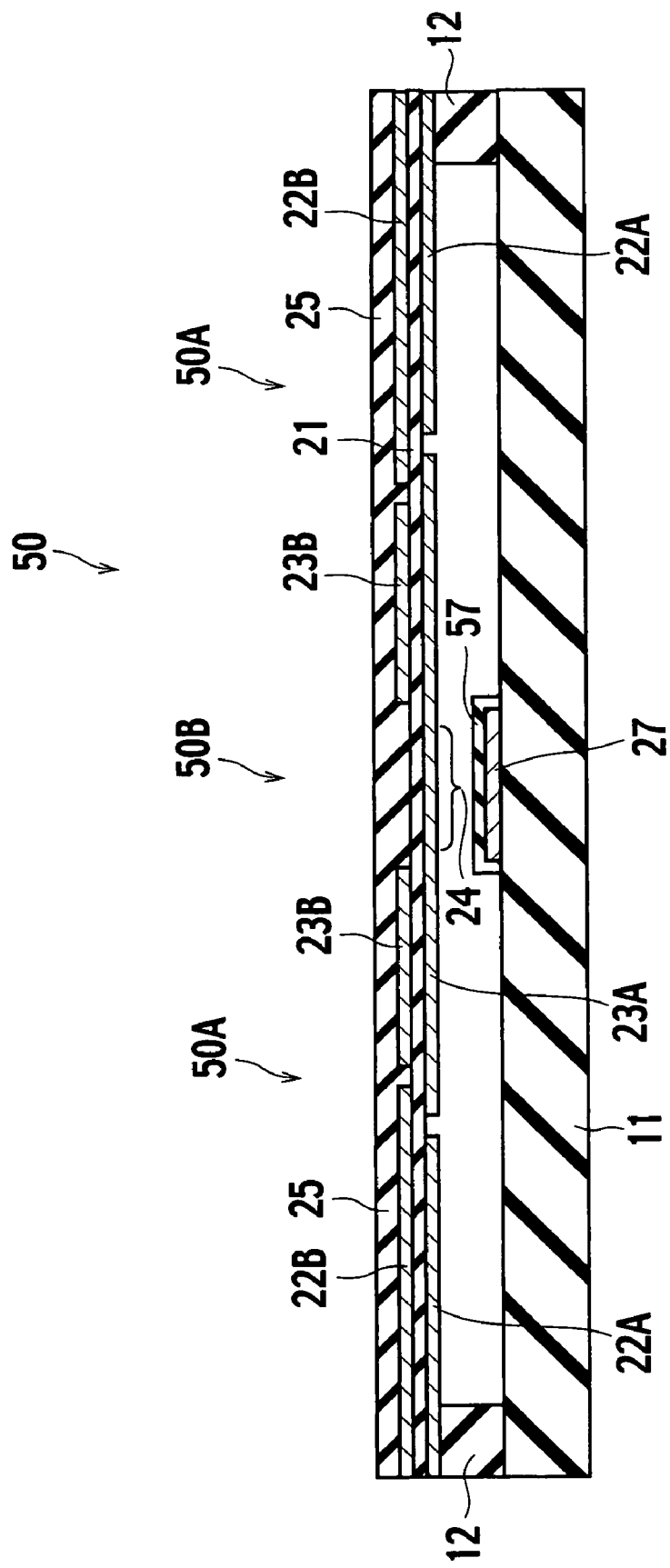
FIG. 15 is a cross section of the upper and lower electrodes, taken along line XV-XV in FIG. 14.

FIG. 14 and FIG. 15 show a micro-mechanical device 50 in a second embodiment. The micro-mechanical device 50 includes a pair of main actuators 50A and a subsidiary actuator 50B. The main actuators 50A are in the shape of a pair of cantilevers, function as first and third piezoelectric actuators, and are supported on the substrate 11 using a pair of first and second anchors 12. A subsidiary actuator 50B is positioned at the center of the main actuators 50A, and serves as a first operating section. The two main actuators 50A extend from the two anchors 12, are positioned at opposite sides of the subsidiary actuator 50B, and are referred as first and second regions, and third and fourth regions, respectively.

A stationary electrode 27 is provided on the substrate 11, and is covered with a dielectric film 57, which prevents the movable electrode 24 and stationary electrode 27 from being short-circuited. This enables the micro-mechanical device 50 to function as a variable capacitor.

The subsidiary actuator 50B includes cantilevers 51 to 54 extending along the peripheral edges of the main actuators 50A. At the cantilevers 51 to 54, a second lower electrode 23A, a piezoelectric film 21, a second upper electrode 23B and a support film 25 are stacked one over after another. First to fourth operating ends 51B to 54B extend from bases 51A to 54A of the cantilevers 51 to 54. The first operating end 51B and second operating end 52B of the cantilevers 51 and 52 face with each other while the first and second operating ends 53B and 54B of the cantilevers 53 and 54 face each other. The cantilevers 51 to 54 are much shorter than the main actuators 50A similarly to those of the micro-mechanical device 10 shown in FIG. 1.

When drive voltages are applied to the lower electrodes 22A and 23A and the upper electrodes 22B and 23B, the main actuators 50A and the subsidiary actuator 50B bend in response to the polarities of the drive voltages, thereby displacing the movable electrode 24 to and from the stationary electrode 27.

Therefore, even if the movable electrode 24 is in firm contact with the dielectric film 57 on the stationary electrode 27, the subsidiary actuator 50B can separate the movable electrode 24 from the dielectric film 27 by applying a large drive force via the cantilevers 51 to 54. This is because the subsidiary actuator 50B is shorter than the main actuator 50A, and has the drive force larger than that of the main actuator 50A.

In the micro-mechanical device 50, the main actuators 50A which support the subsidiary actuator 50B is in the shape of a pair of cantilevers, so that the movable electrode 24 can be more reliably actuated. Further, the movable electrode 24 which is symmetrically supported at its opposite ends and the stationary electrode 27 (and the dielectric film 57) are more stably maintained parallel.

When the foregoing micro-mechanical device 50 is used, the variable capacitor can increase its capacitance.

Example 2

Figure 16:
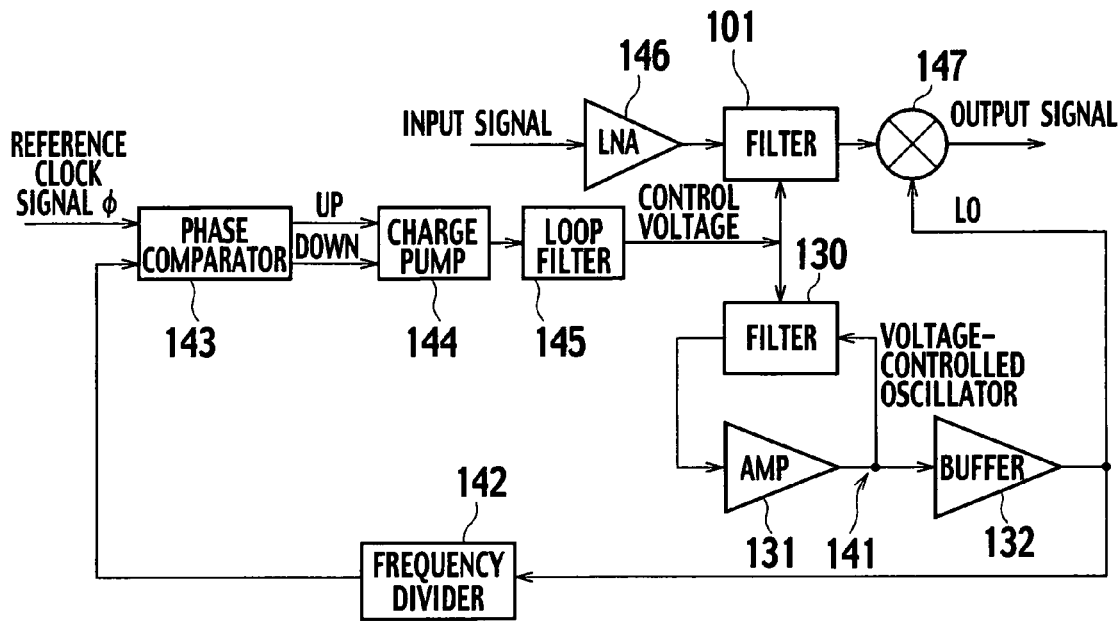
FIG. 16 is a block diagram of a high frequency circuit in an example of the second embodiment.
Figure 17:
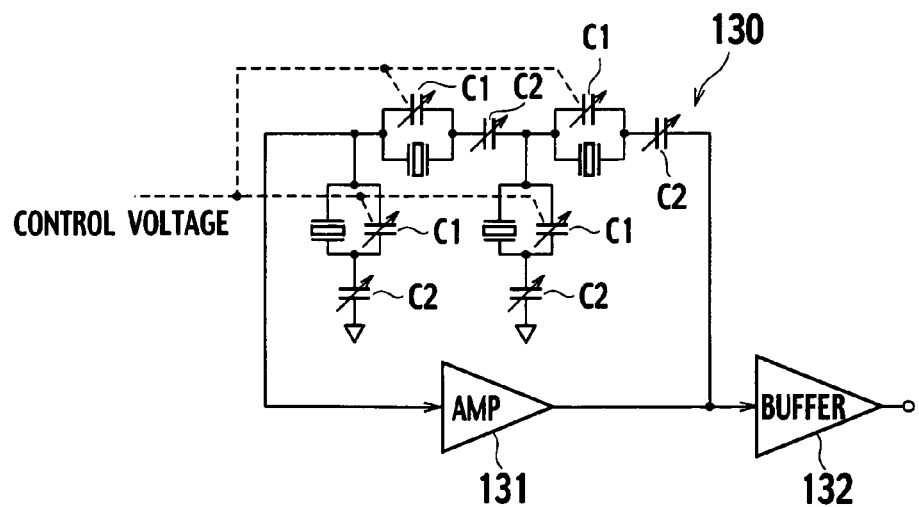
FIG. 17 is a circuit diagram of a voltage-controlled oscillator in the high frequency circuit of FIG. 16.

Referring to FIG. 16 and FIG. 17, an example will be described, in which the micro-mechanical device 50 assembled in a cellular phone system or the like as variable capacitors C1 and C2.

FIG. 16 is a block diagram of a PLL (phase locked loop) circuit which constitutes a part of a receiver circuit using a variable frequency filter used in a cellular phone system. The PLL circuit includes a voltage-controlled oscillator 141 (constituted by a filter 130, an amplifier 131 and a buffer amplifier 132), a frequency divider 142, a phase comparator 143, a charge pump 144, a loop filter 145, a low noise amplifier (LNA) 146, a variable frequency filter 101, and a down-conversion mixer 147.

The voltage control oscillator 141 has a circuit configuration as shown in FIG. 17, is constituted by the variable frequency filter 130, amplifier 131 and buffer amplifier 132, and feeds frequency contents passing through the variable frequency filter 130 back to an input of the amplifier 131. The variable capacitors C1 and C2 of the present invention are used in the voltage control oscillator 141. The variable frequency filter 101 is configured similarly to the filter 130, and can be realized using the variable capacitors C1 and C2.

When a frequency oscillated by the voltage control oscillator 141 is larger or smaller than a predetermined frequency, the PLL circuit detects a difference between the oscillated frequency and the predetermined frequency, and feeds a DC control voltage, corresponding to the difference, back to the variable capacitor C1 in the variable frequency filter 101 constituting the voltage control oscillator 141. Therefore, the frequency oscillated by the voltage control oscillator 141 can be made equal to the predetermined frequency so long as the feed-back loop operates normally and stably, and phase locking is accomplished.

The PLL circuit (in FIG. 16) uses the variable frequency filter 130 of the voltage control oscillator 141, and the variable frequency filter 101 as a band-pass filter for communication signal filtration. An output signal of the low noise amplifier 146 is inputted into the variable frequency filter 101, and output signal of which is transmitted to one of input terminals of the down-conversion mixer 147.

A reference signal produced by the voltage control oscillator 141 is transmitted as a local oscillation signal (LO) to the other input terminal of the down-conversion mixer 147. Therefore, a high frequency signal is converted to a base band signal frequency.

In the second example, the same control voltage produced by the loop filter 145 is applied not only to the variable frequency filter 101 but also to the variable frequency filter 130 of the voltage control oscillator 141. The oscillation frequency of the voltage control oscillator 141 is made equal to a center pass band frequency of the variable frequency filter 101.

In the second example, the micro-mechanical device 50 having the structure (shown in FIG. 14 and FIG. 15) is utilized as the variable capacitors C1 and C2. Alternatively, the micro-mechanical device 10 in the cantilever shape (shown in FIG. 1 to FIG. 4) can be used as the variable capacitors C1 and C2. In such a case, a dielectric film is provided on the stationary electrode 27 in order to prevent short-circuiting of the movable and stationary electrodes 24 and 27.

Further, in the second example, the micro-mechanical device 50 including the dielectric film 57 is used as the variable capacitors C1 and C2. Alternatively, a micro-switch without the dielectric film 57 may be activated without being short-circuited.

Still further, the micro-mechanical device 50 is used in the second example as the variable capacitors C1 and C2 constituting the voltage control oscillator or the filter. Alternatively, the micro-mechanical device 50 is applicable as variable capacitors for a variety of high frequency circuits. For instance, when the variable filter of the invention and an inductor are connected in parallel or in series, they can constitute a variable resonance frequency tank circuit, which is usable as an impedance matching circuit for a tunable antenna or a wide band amplifier.

OTHER EMBODIMENTS

In the foregoing embodiments, the micro-mechanical device 50 is applied as the variable capacitor. Alternatively, the micro-mechanical device 50 without the dielectric film 57 may be applied as a micro-switch in which the movable and stationary electrodes 24 and 27 are in contact with each other. When used in combination with a high frequency antenna switching circuit or a plurality of filters, such a micro-switch is usable as a high frequency filter bank.

The main and subsidiary actuators 50A and 50B have the asymmetric bimorph structure in which the lower electrodes, piezoelectric film, upper electrodes and support film are stacked over one after another. Alternatively, the main and subsidiary actuators 50A and 50B may have the symmetric bimorph structure in which the lower electrodes, first piezoelectric film, intermediate electrode, second piezoelectric film, and upper electrodes are stacked one over after another. The actuators may be activated by applying voltages of reverse polarities between the lower electrodes and the intermediate electrode and between the upper electrodes and the intermediate electrode.

THIRD EMBODIMENT

Figure 18:
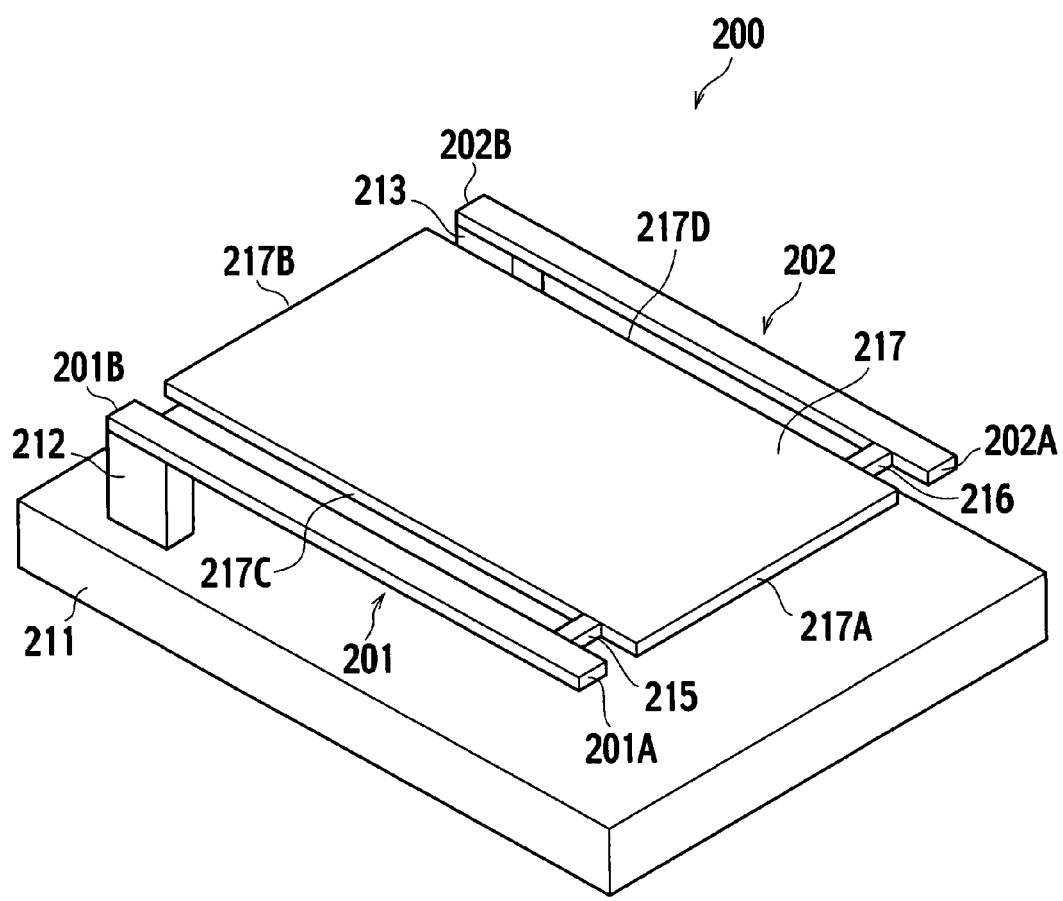
FIG. 18 is a perspective view of a micro-mechanical device according to a third embodiment of the invention.

A micro-mechanical device 200 shown in FIG. 18 is used as an optical switch, and includes a pair of main actuators 201 and 202 in the shape of a cantilever (functioning as first and second piezoelectric actuators), and a mirror 217 connected to the main actuators 201 and 202 using connectors 215 and 216. The main actuators 201 and 202 are supported on a substrate 211 using anchors 212 and 213.

Figure 19:
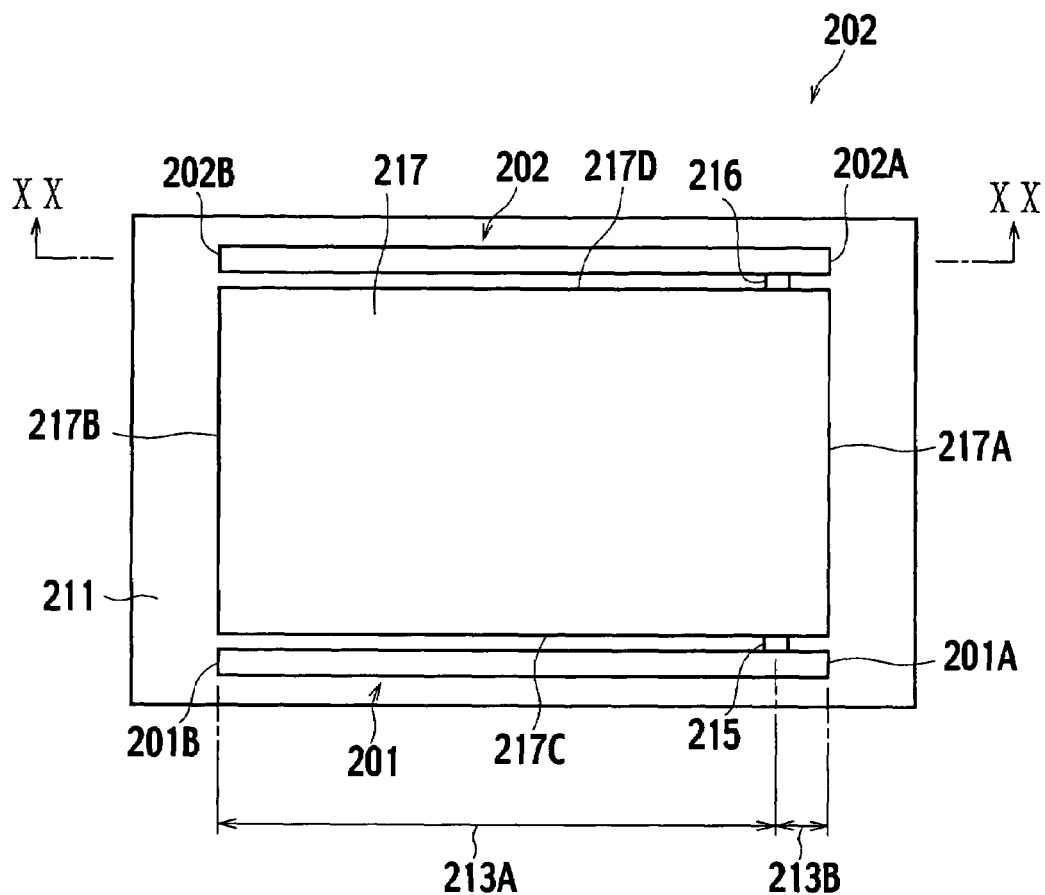
FIG. 19 is a top plan view of the micro-mechanical device of FIG. 18.
Figure 20:
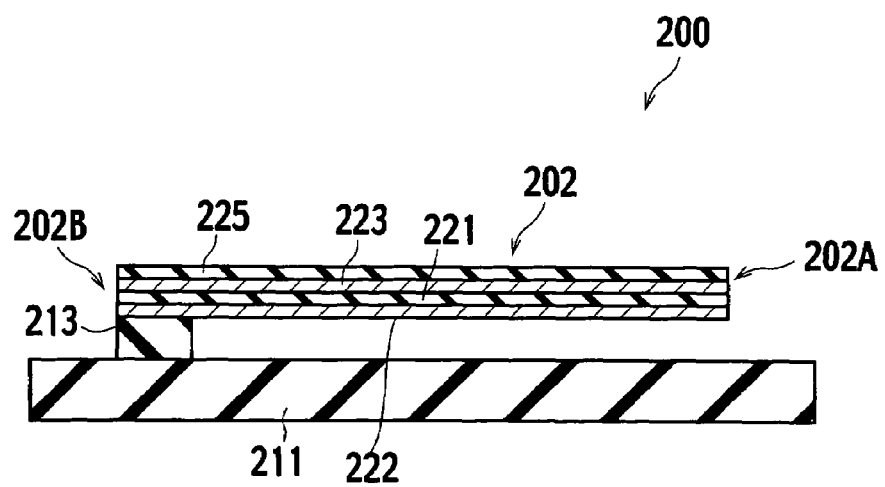
FIG. 20 is a cross section of the micro-mechanical device, taken along line XX-XX in FIG. 19.

Referring to FIG. 19, the main actuators 201 and 202 extend along opposite side edges (first side edge 217C and second side edge 217D) of the mirror 217. As shown in FIG. 20, in the main actuator 202, a piezoelectric film 221 is sandwiched between a lower electrode 222 and an upper electrode 223. A support film 225 extends over the upper electrode 223. The main actuator 201 is structured similarly to the main actuator 202.

The substrate 211 is an insulating glass substrate or a silicon (Si) semiconductor substrate or the like. The anchor 212 is made of an insulating silicon oxide ($SiO_2$) film or the like. The support film 225 is made of an insulating film of silicon oxide ($SiO_2$), silicon nitride ($Si_3N_4$) or the like. The lower and upper electrodes 222 and 223 are preferably made of metals having low resistance and being easy to process such as aluminum (Al), gold (Au), platinum (Pt), copper (Cu), iridium (Ir), tungsten (W), and molybdenum (Mo). The piezoelectric film 221 is preferably made of a wurtzite crystal which is stable, is easy to manufacture and is compatible to Si process, such as aluminum nitride (AlN) and zinc oxide (ZnO). Lead zirconate titanate (PZT) is also applicable to the piezoelectric film 221. The mirror 217 includes an aluminum (Al) film extending over a base material. The aluminum film reflects light beams.

The main actuators 201 and 202 are connected, near the operating ends 201A and 202A thereof, to the first and second side edges 217C and 217D of the mirror 217 via the connectors 215 and 216. In short, the main actuators 201 and 202 are connected to the mirror 217 near a front end 217A thereof.

Referring to FIG. 18, the main actuators 201 and 202 not in a bending state and the mirror 217 are maintained in parallel to the substrate 211 in a cantilever state. A rear end 217B of the mirror 217 functions as a free end.

When a drive voltage is applied between the lower electrode 222 and the upper electrode 223, the main actuators 201 and 202 will bend depending upon a polarity of the drive voltage. For instance, if a positive drive voltage is applied to the lower electrode 223, the main actuators 201 and 202 bend to let their operating ends 201A and 202A come close to the substrate 211. Conversely, if a negative drive voltage is applied to the lower electrode 223, the main actuators 201 and 202 bend to make their operating ends 201A and 202A separate from the substrate 211.

Figure 21:
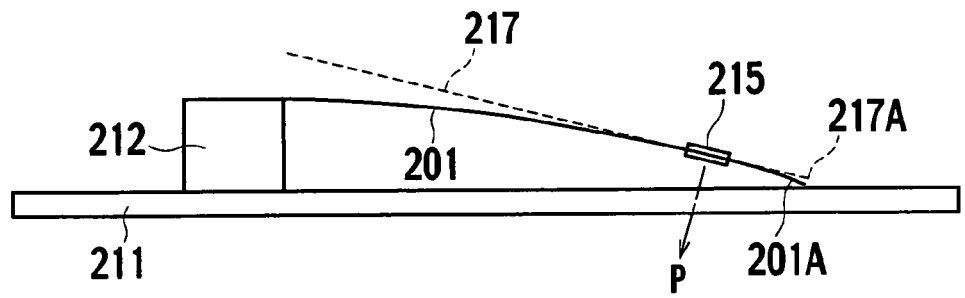
FIG. 21 is a schematic side elevation showing an operation of the micro-mechanical device of FIG. 18.

The application of a first drive voltage to the lower and upper electrodes 222 and 223 causes the main actuators 201 and 202 to bend, and their operating ends 201A and 202A to come into contact with the substrate 211, as shown in FIG. 21. In this state, the mirror 217 inclines as the main actuators 201 and 202 bend.

When the polarity of the drive voltage is reversed, the main actuators 201 and 202 bend to let their operating ends 201A and 202A come off from the substrate 211. In this state, if the operating ends 201A and 202A of the actuators 201 and 202 are in very firm contact with the substrate 211, the connector 215 is displaced toward the substrate 211 as shown by an arrow P.

Figure 22:
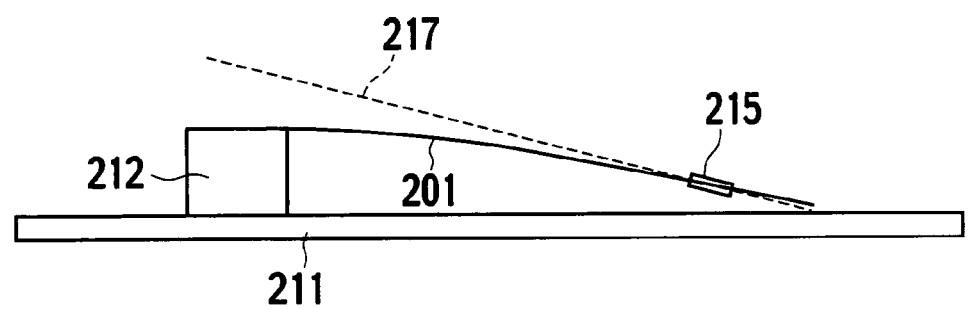
FIG. 22 is a schematic side elevation showing the operation of the micro-mechanical device of FIG. 18.

In response to the foregoing displacement, the front end 217A of the mirror 217 comes into contact with the substrate 211, and pushes the substrate 211. Refer to FIG. 22. In this state, the front end 217A of the mirror 21 serves as an operating end and pushes the substrate 211, thereby separating the operating ends 201A and 202A of the main actuators 201 and 202 from the substrate 211.

Figure 23:
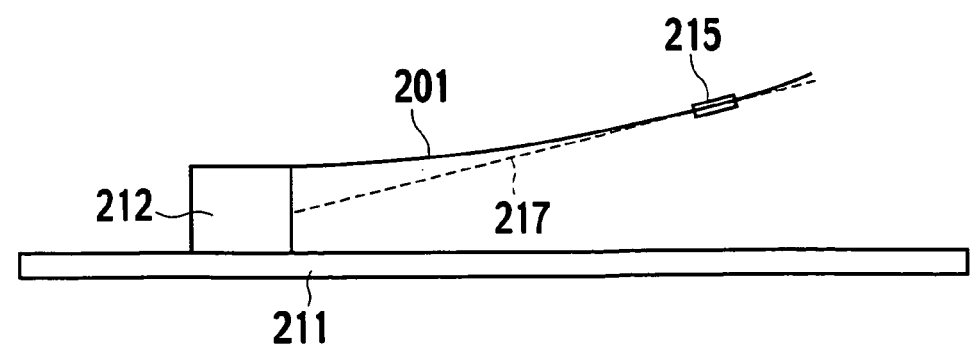
FIG. 23 is a schematic side elevation showing the operation of the micro-mechanical device of FIG. 18.

Once the operating ends 201A and 202A are separated from the substrate 211, the main actuators 201 and 202 bend as shown in FIG. 23, which further separates the operating ends 201A and 202A from the substrate 211.

When the operating ends 201A and 202A of the main actuators 201 and 202 are in firm contact with the substrate 211, the region between stationary ends 201B (202B) of the main actuators 201 (202) by anchors 212 (213), and the connectors 215 (216) function as the main actuators. Further, the connectors 215 (216), and the front end 217A of the mirror 217 function as the subsidiary actuator.

A first region 213A (shown in FIG. 19) functioning as the main actuator is much longer than a second region 213B functioning as the subsidiary actuator. Force for the front end 217A of the mirror 217 to push the substrate 211 in the region 213B is much larger than a force for separating the operating ends 201A and 202A off from the substrate 211 in response to the bending of the main actuators 201 and 202 in the region 213A.

Therefore, the operating ends 201A and 202A can be easily separated from the substrate 211.

Referring to FIG. 23, the connectors 215 and 216 are extensively separated from the substrate 211 because of the main actuators 201 and 202 whose operating ends 201A and 202A are separated from the substrate 211. This changes an angle of the mirror 217.

The micro-mechanical device 200 can function as an optical switch when the mirror 217 is disposed in a light path and has its angle changed.

The foregoing description relates to the application of the micro-mechanical device 200 to the optical switch. Alternatively, when a plurality of micro-mechanical devices 200 are arranged for respective pixels, they can function as an optical projector.

In the foregoing embodiments, the main actuators 201 and 202 have the asymmetric bimorph structure. Alternatively, the main actuators may have the symmetric bimorph structure in which the lower electrodes, first piezoelectric film, intermediate electrode, second piezoelectric film, and upper electrodes are stacked one over after another. The actuators may be actuated by applying reverse voltages between the lower electrodes and intermediate electrode and between the upper electrodes and intermediate electrode.

What is claimed is:

1. A micro-mechanical device comprising:
   a first piezoelectric actuator including a piezoelectric film and lower and upper electrodes interleaving the piezoelectric film, and extending from a first fixing part on a substrate to a first operating end; and
   a second piezoelectric actuator connected to the first piezoelectric actuator via a connecting part at the first operating end of the first piezoelectric actuator, and extending from the connecting part to a second operating end, the second piezoelectric actuator being shorter than the first piezoelectric actuator.

2. The micro-mechanical device of claim 1, wherein the second piezoelectric actuator is constituted by a part of the first piezoelectric actuator including the piezoelectric film, and lower and upper electrodes.

3. The micro-mechanical device of claim 1 further comprising a third piezoelectric actuator extending from a second fixing part on the substrate to the first operating end, the third piezoelectric actuator supporting the second piezoelectric actuator together with the first piezoelectric actuator.

4. The micro-mechanical device of claim 1, wherein the first piezoelectric actuator is divided into first and second regions between the first fixing part and the first operating end; and polarities of the lower and upper electrodes are reverse at the first and second regions.

5. The micro-mechanical device of claim 4, wherein the second piezoelectric actuator is constituted by a part of the first piezoelectric actuator and includes a number of the second operating ends; and polarities of the lower and upper electrodes at the second operating ends are the same as a polarity at the second region.

6. The micro-mechanical device of claim 3, wherein the first piezoelectric actuator has first and second regions which are divided between the first fixing part and the first operating end; the third piezoelectric actuator has third and fourth regions which are divided between the second fixing part and the first operating end; polarities of the lower and upper electrodes are reverse at the first and second regions; and polarities of the lower and upper electrodes are reverse at the third and fourth regions.

7. The micro-mechanical device of claim 6, wherein the second piezoelectric actuator is constituted by a part of the first piezoelectric actuator, and includes a number of second operating ends; and polarities of the lower and upper electrodes at the second operating ends are the same as polarities of the second and fourth regions.

8. A micro-switch comprising:
   a first piezoelectric actuator including a piezoelectric film and lower and upper electrodes interleaving the piezoelectric film, and extending from a first fixing part on a substrate to a first operating end;

a second piezoelectric actuator connected to the first piezoelectric actuator via a connecting part at the first operating end of the first piezoelectric actuator, and extending from the connecting part to a second operating end, the second piezoelectric actuator being shorter than the first piezoelectric actuator;

a movable electrode provided at the first operating end; and a stationary electrode provided on the substrate and facing with the movable electrode.

9. The micro-switch of claim 8 further comprising a third piezoelectric actuator extending from a second fixing part on the substrate to the first operating end, the third piezoelectric actuator supporting the second piezoelectric actuator together with the first piezoelectric actuator.

10. The micro-switch of claim 8, wherein the first piezoelectric actuator is divided into first and second regions between the first fixing part and the first operating end, and polarities of the lower and upper electrodes are reverse at the first and second regions.

11. The micro-switch of claim 10, wherein the second piezoelectric actuator is constituted by a part of the first piezoelectric actuator and includes a number of the second operating ends; and polarities of the lower and upper electrodes at the second operating ends are the same as a polarity at the second region.

12. A variable capacitor comprising:

a first piezoelectric actuator including a piezoelectric film and lower and upper electrodes interleaving the piezoelectric film, and extending from a first fixing part on a substrate to a first operating end;

a second piezoelectric actuator connected to the first piezoelectric actuator via a connecting part at the first operating end of the first piezoelectric actuator, and extending from the connecting part to a second operating end, the second piezoelectric actuator being shorter than the first piezoelectric actuator;

a movable electrode provided at the first operating end; a stationary electrode provided on the substrate and facing with the movable electrode: and a dielectric film provided on the stationary electrode.

13. The variable capacitor of claim 12 further comprising a third piezoelectric actuator extending from a second fixing part on the substrate to the first operating end, the third piezoelectric actuator supporting the second piezoelectric actuator together with the first piezoelectric actuator.

14. The variable capacitor of claim 12, wherein the first piezoelectric actuator is divided into first and second regions between the first fixing part and the first operating end; and polarities of the lower and upper electrodes are reverse at the first and second regions.

15. The variable capacitor of claim 14, wherein the second piezoelectric actuator is constituted by a part of the first piezoelectric actuator and includes a number of the second operating ends; and polarities of the lower and upper electrodes at the second operating ends are the same as a polarity at the second region.

16. A high frequency circuit comprising the variable capacitor of claim 12, wherein a capacity of the high frequency circuit is controlled by a control voltage of a voltage-controlled oscillator.

* * * * *